(12) United States Patent
Bedeschi et al.

(10) Patent No.: US 12,051,463 B2
(45) Date of Patent: *Jul. 30, 2024

(54) DECODER ARCHITECTURE FOR MEMORY DEVICE

(71) Applicant: Micron Technology, Inc., Boise, ID (US)

(72) Inventors: Ferdinando Bedeschi, Biassono (IT); Jeffrey E. Koelling, Fairview, TX (US); Hari Giduturi, Folsom, CA (US); Riccardo Muzzetto, Arcore (IT); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/864,004

(22) Filed: Jul. 13, 2022

(65) Prior Publication Data

US 2022/0399055 A1 Dec. 15, 2022

Related U.S. Application Data

(63) Continuation of application No. 17/108,763, filed on Dec. 1, 2020, now Pat. No. 11,398,276.

(51) Int. Cl.
*G11C 13/00* (2006.01)

(52) U.S. Cl.
CPC ...... *G11C 13/0026* (2013.01); *G11C 13/0004* (2013.01); *G11C 13/0028* (2013.01); *G11C 13/003* (2013.01); *G11C 13/0033* (2013.01)

(58) Field of Classification Search
CPC ............ G11C 13/0026; G11C 13/0004; G11C 13/0028; G11C 13/003; G11C 13/0033; G11C 8/10; G11C 13/0038; G11C 13/0023; G11C 5/063; G11C 5/066
See application file for complete search history.

(56) References Cited

U.S. PATENT DOCUMENTS

| | | | |
|---|---|---|---|
| 5,654,930 A | 8/1997 | Yoo et al. | |
| 5,748,538 A * | 5/1998 | Lee | G11C 11/5628 257/E27.103 |
| 5,867,445 A | 2/1999 | Kirsch et al. | |
| 2002/0110040 A1 | 8/2002 | Kwon | |
| 2003/0012075 A1 | 1/2003 | Inaba et al. | |
| 2006/0092750 A1 | 5/2006 | Jeon et al. | |

(Continued)

*Primary Examiner* — Khamdan N. Alrobaie
(74) *Attorney, Agent, or Firm* — Holland & Hart LLP

(57) ABSTRACT

Methods, systems, and devices for decoder architecture for memory device are described. An apparatus includes a memory array having a memory cell and an access line coupled with the cell and a decoder having a first stage and a second stage. The decoder supplying a first voltage during a first access operation and a second voltage during a second access operation to the access line. The second stage of the decoder includes a first transistor that supplies the first voltage based on a third voltage at the source of the first transistor exceeding a fourth voltage at a gate of the first transistor and a first threshold voltage. The second stage includes a second transistor that supplies the second voltage based on a fifth voltage at a gate of the second transistor exceeding a sixth voltage at the source of the second transistor and a second threshold voltage.

19 Claims, 6 Drawing Sheets

(56) References Cited

U.S. PATENT DOCUMENTS

| | | | |
|---|---|---|---|
| 2010/0054032 A1* | 3/2010 | De Sandre | G11C 8/08 365/163 |
| 2010/0232209 A1 | 9/2010 | Kawabata et al. | |
| 2014/0160875 A1 | 6/2014 | Fontana et al. | |
| 2019/0036743 A1 | 1/2019 | Dimitriu | |

* cited by examiner

DECODER ARCHITECTURE FOR MEMORY DEVICE

CROSS REFERENCE

The present Application for Patent is a continuation of U.S. patent application Ser. No. 17/108,763 by Bedeschi et al., entitled "DECODER ARCHITECTURE FOR MEMORY DEVICE," filed Dec. 1, 2020, assigned to the assignee hereof, and is expressly incorporated by reference in its entirety herein.

FIELD OF TECHNOLOGY

The following relates generally to one or more systems for memory and more specifically to decoder architecture for memory device.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
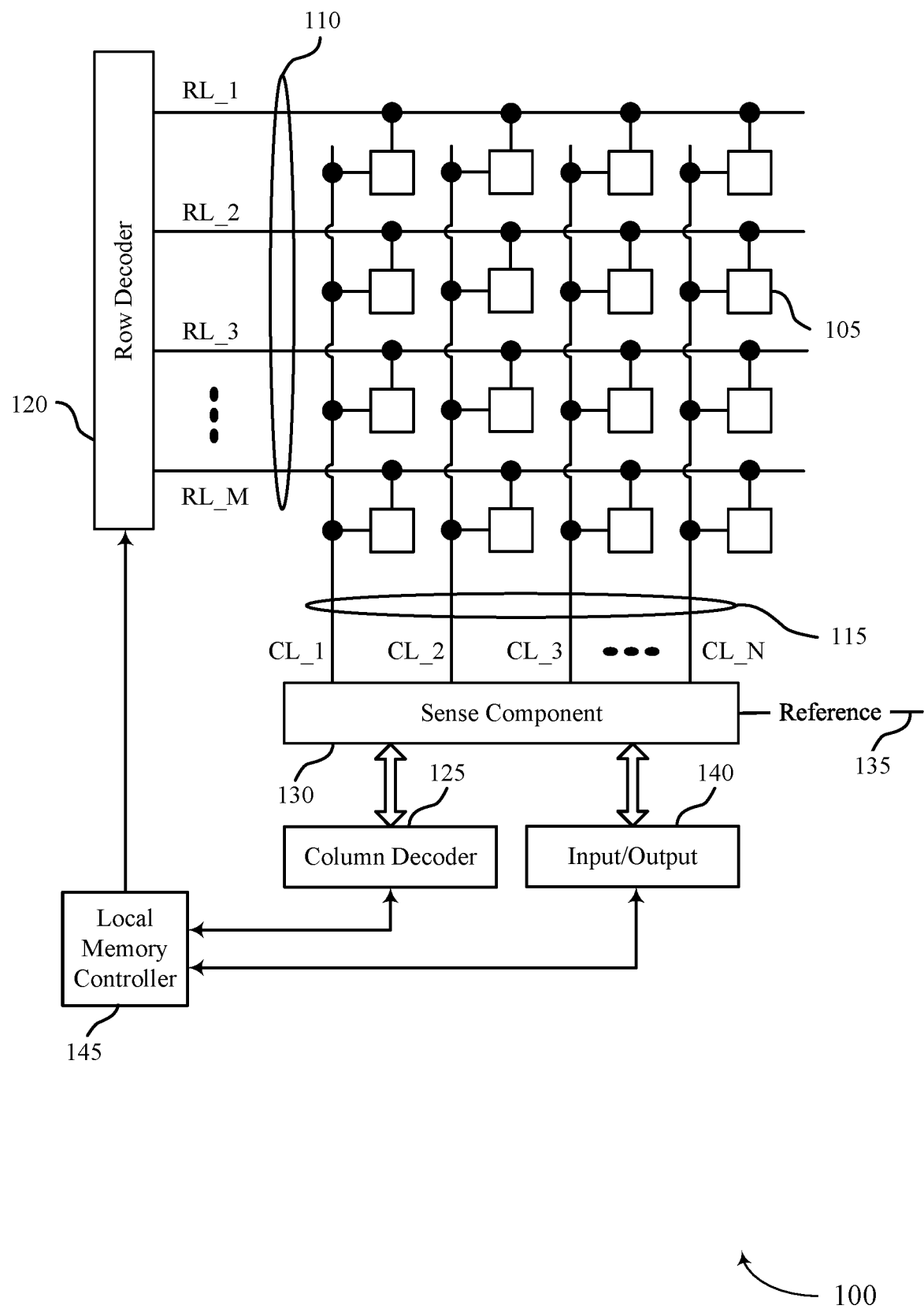
FIG. 1 illustrates an example of a memory die that supports decoder architecture for memory device in accordance with examples as disclosed herein.

A memory device may include an array of memory cells (e.g., a memory array) to store data for a host device. In some examples, the memory device may read data from or write data to the memory cells based on a command from the host device. In such examples, the memory device may drive a voltage on an access line (e.g., word line or bit line) coupled with the memory cell to activate the memory cell and perform the read operation or the write operation. The memory device may implement decoders (e.g., column decoders or row decoders) to decode a memory address associated with the host device command and activate an access line coupled with a memory cell associated with the command. In some examples, the decoders may be positioned under the memory array. In such examples, as the size of the memory arrays decreases, it may be challenging to reduce the size of the decoders in a similar proportion. For example, the size of the memory array may decrease but a voltage to activate the memory cells may not decrease and thus the components in the decoder to apply the voltage may be challenging to shrink. That is, a memory device utilizing a high voltage may include transistors with oxide capable of isolating the high voltage from the access line. In some examples, it may be difficult to scale down the size and dimensions of the oxide while still isolating the high voltage. Additionally, in some examples, it may be difficult to design decoders that scale down in proportion to the memory array and prevent disturbances on adjacent access lines. That is, scaling down the decoder may increase a likelihood that a voltage is also applied to an adjacent access line of an untargeted memory cell.

Systems, techniques, and devices are described herein for a memory device that includes a decoder having a first stage that is configured to supply an access line coupled with a memory cell with a positive voltage, a negative voltage, or a ground voltage based on a command received from a host device. For example, the first stage of the decoder may include a first transistor that supplies a positive voltage during a first access operation, a second transistor that supplies a negative voltage during a second access operation, and a third transistor that supplies a ground voltage during a duration between the first access operation and the second access operation. That is, the decoder may be configured to provide a bipolar programing voltage (e.g., a positive or a negative voltage) to the memory cell. In some examples, a voltage to drive the access lines may be decreased by half as compared with other solutions. In such examples, a thickness of an oxide utilized to isolate from a high voltage may be reduced and allow for the decoder to scale down. In some examples, the third transistor may also act as a voltage clamp and reduce a likelihood of disturbing an adjacent line. The decoder may also include a second stage and a third stage to supply the voltages and provide level shifters. Such a configuration may enable the decoder to scale down in proportion to the scaling down of the memory device. In such examples, a decoder may continue to be positioned under the memory array, even as the memory array scales down to a smaller size, and thereby avoid additional routing between memory arrays and their supporting circuitry.

Features of the disclosure are initially described in the context of memory systems, dies, and arrays as described with reference to FIGS. 1 and 2. Features of the disclosure are described in the context of decoders and circuits as described with reference to FIGS. 3 and 4. These and other features of the disclosure are further illustrated by and described with reference to an apparatus diagram and flowcharts that relate to decoder architecture for memory device as described with references to FIGS. 5 and 6.

FIG. 1 illustrates an example of a memory die 100 that supports decoder architecture for memory device in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11).

A memory cell 105 may store a logic state using a configurable material, which may be referred to as a memory element, a memory storage element, a material element, a material memory element, a material portion, or a polarity-written material portion, among others. A configurable material of a memory cell 105 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 100 may include the access lines (e.g., row lines 110 and the column lines 115) arranged in a pattern, such as a grid-like pattern. Access lines may be formed of one or more conductive materials. In some examples, row lines 110 may be referred to as word lines. In some examples, column lines 115 may be referred to as digit lines or bit lines. References to access lines, row lines, column lines, word lines, digit lines, or bit lines, or their analogues, are interchangeable without loss of understanding or operation. Memory cells 105 may be positioned at intersections of the row lines 110 and the column lines 115.

Operations such as reading and writing may be performed on the memory cells 105 by activating or selecting access lines such as one or more of a row line 110 or a column line 115. By biasing a row line 110 and a column line 115 (e.g., applying a voltage to the row line 110 or the column line 115), a single memory cell 105 may be accessed at their intersection. The intersection of a row line 110 and a column line 115 in either a two-dimensional or three-dimensional configuration may be referred to as an address of a memory cell 105. An access line may be a conductive line coupled with a memory cell 105 and may be used to perform access operations on the memory cell 105.

Accessing the memory cells 105 may be controlled through a row decoder 120 or a column decoder 125. For example, a row decoder 120 may receive a row address from the local memory controller 145 and activate a row line 110 based on the received row address. A column decoder 125 may receive a column address from the local memory controller 145 and may activate a column line 115 based on the received column address. In some examples, the row decoder 120 and/or the column decoder 125 may be located under the memory array (e.g., under the memory cells 105). The row decoder 120 and the column decoder 125 may include three stages (e.g., a first stage, a second stage, and a third stage). In some examples, the first stage of the row decoder 120 and the column decoder 125 may be coupled with the row line 110 or the column line 115 respectively. The second stage of the row decoder 120 and the column decoder 125 may be coupled with the first stage and configured to activate the first stage associated with the row address or the column address. That is, the row decoder 120 and the column decoder 125 may include a plurality of first stages, each first stage coupled with a different row line 110 or column line 115. The row decoder or column decoder 125 may utilize the second stage to activate the first stage associated with the row address or column address. The row decoder 120 and column decoder 125 may also include a third stage is configured to supply a voltage to the first stage and the row line 110 and the column line 115.

In some examples, the row decoder 120 and column decoder 125 may provide a voltage based on a command received from a host device or the stage of the memory die 110. For example, the row decoder 120 and column decoder 125 may provide a positive voltage to the row line 110 and the column line 115, respectively, in response to a first access command from the host device. In other examples, the row decoder 120 and column decoder 125 may provide a negative voltage to the row line 110 and the column line 115, respectively, in response to a second access command from the host device. That is, memory cell 105 may be capable of being programmed with either a negative voltage pulse or a positive voltage pulse (e.g., bipolar programming) and the row decoder 120 and column decoder 125 may activate the memory cell with the positive or negative voltage depending on the command received from the host device. In other examples, the row decoder 120 and column decoder 125 may provide a ground voltage to the row line 110 and the column line 115, respectively. For example, the row decoder 120 and column decoder 125 may provide the ground voltage during a reset operation or during a period between the first access operation and the second access operation.

In some examples, the first stage of the row decoder 120 and the column decoder 125 may include three (3) transistors. The simplicity of the first stage of the row decoder 120 and the column decoder 125 may allow the row decoder 120 and column decoder 125 to scale down in proportion to a scaling down of the memory die 100—e.g., the row decoder 120 and column decoder 125 may get smaller in proportion to a scaling down of the memory die 100 to save additional space. In such examples, a first transistor of the first stage may be configured to supply the positive voltage, the second transistor of the first stage may be configured to supply the negative voltage, and the third transistor of the first stage may be configured to supply the ground voltage. Additional details related to the first stage are described with reference to FIGS. 4A-4C.

The sense component 130 may be operable to detect a state (e.g., a material state, a resistance, a threshold state) of a memory cell 105 and determine a logic state of the memory cell 105 based on the stored state. The sense component 130 may include one or more sense amplifiers to amplify or otherwise convert a signal resulting from accessing the memory cell 105. The sense component 130 may compare a signal detected from the memory cell 105 to a reference 135 (e.g., a reference voltage). The detected logic state of the memory cell 105 may be provided as an output of the sense component 130 (e.g., to an input/output 140), and may indicate the detected logic state to another component of a memory device that includes the memory die 100.

The local memory controller 145 may control the accessing of memory cells 105 through the various components (e.g., row decoder 120, column decoder 125, sense component 130). In some examples, one or more of the row decoder 120, column decoder 125, and sense component 130 may be co-located with the local memory controller 145. The local memory controller 145 may be operable to receive one or more of commands or data from one or more different memory controllers (e.g., an external memory controller associated with a host device, another controller associated with the memory die 100), translate the commands or the data (or both) into information that can be used by the memory die 100, perform one or more operations on the memory die 100, and communicate data from the memory die 100 to a host device based on performing the one or more operations. The local memory controller 145 may generate row signals and column address signals to activate the target row line 110 and the target column line 115. The local memory controller 145 may also generate and control various voltages or currents used during the operation of the memory die 100. In general, the amplitude, the shape, or the duration of an applied voltage or current discussed herein may be varied and may be different for the various operations discussed in operating the memory die 100.

The local memory controller 145 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 145 in response to various access commands (e.g., from a host device). The local memory controller 145 may be operable to perform other access operations not listed here or other operations related to the operating of the memory die 100 that are not directly related to accessing the memory cells 105.

The local memory controller 145 may be operable to perform a write operation (e.g., a programming operation) on one or more memory cells 105 of the memory die 100. During a write operation, a memory cell 105 of the memory die 100 may be programmed to store a desired logic state. The local memory controller 145 may identify a target memory cell 105 on which to perform the write operation. The local memory controller 145 may identify a target row line 110 and a target column line 115 coupled with the target memory cell 105 (e.g., the address of the target memory cell 105). The local memory controller 145 may activate the target row line 110 and the target column line 115 (e.g., applying a voltage to the row line 110 or column line 115) to access the target memory cell 105. The local memory controller 145 may apply a specific signal (e.g., write pulse) to the column line 115 during the write operation to store a specific state in the storage element of the memory cell 105. The pulse used as part of the write operation may include one or more voltage levels over a duration.

The local memory controller 145 may be operable to perform a read operation (e.g., a sense operation) on one or more memory cells 105 of the memory die 100. During a read operation, the logic state stored in a memory cell 105 of the memory die 100 may be determined. The local memory controller 145 may identify a target memory cell 105 on which to perform the read operation. The local memory controller 145 may identify a target row line 110 and a target column line 115 coupled with the target memory cell 105 (e.g., the address of the target memory cell 105). The local memory controller 145 may activate the target row line 110 and the target column line 115 (e.g., applying a voltage to the row line 110 or column line 115) to access the target memory cell 105. The sense component 130 may detect a signal received from the memory cell 105 that is based on the pulse applied to the row line 110, the pulse applied to the column line, and/or a resistance or threshold characteristic of the memory cell 105. The sense component 130 may amplify the signal. The local memory controller 145 may activate the sense component 130 (e.g., latch the sense component) and thereby compare the signal received from the memory cell 105 to the reference signal 135. Based on that comparison, the sense component 130 may determine a logic state that is stored on the memory cell 105. The pulse used as part of the read operation may include one or more voltage levels over a duration.

Figure 2:
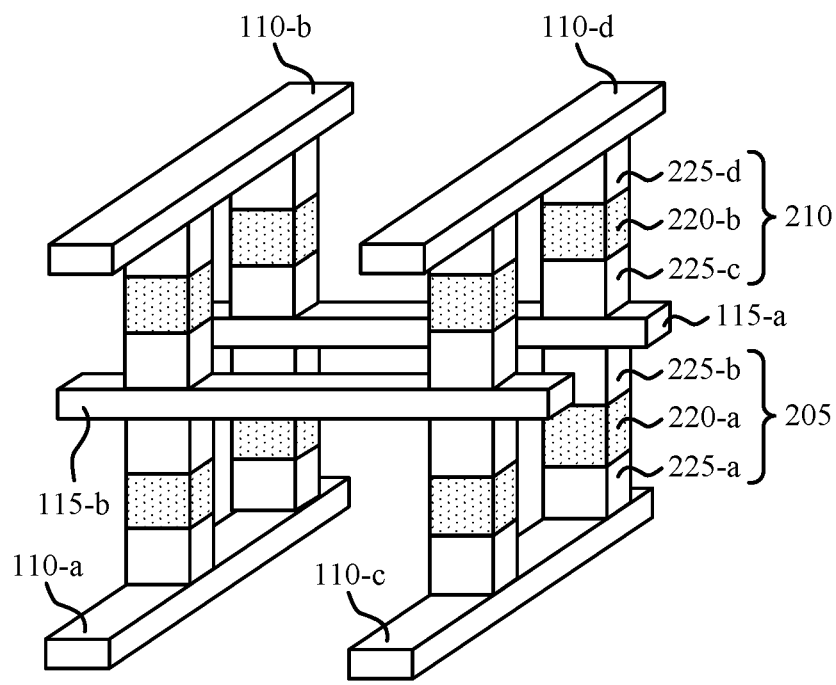
FIG. 2 illustrates an example of memory cells that support decoder architecture for memory device in accordance with examples as disclosed herein.

FIG. 2 illustrates an example of a memory array 200 in accordance with examples as disclosed herein. Memory array 200 may be an example of portions of the memory arrays or memory dies described with reference to FIG. 1. The memory array 200 may include a first deck 205 of memory cells that is positioned above a substrate (not shown) and a second deck 210 of memory cells on top of the first array or deck 205. Though the example of memory array 200 includes two decks 205, 210, the memory array 200 may include any quantity of decks (e.g., one or more than two).

Figure 3:
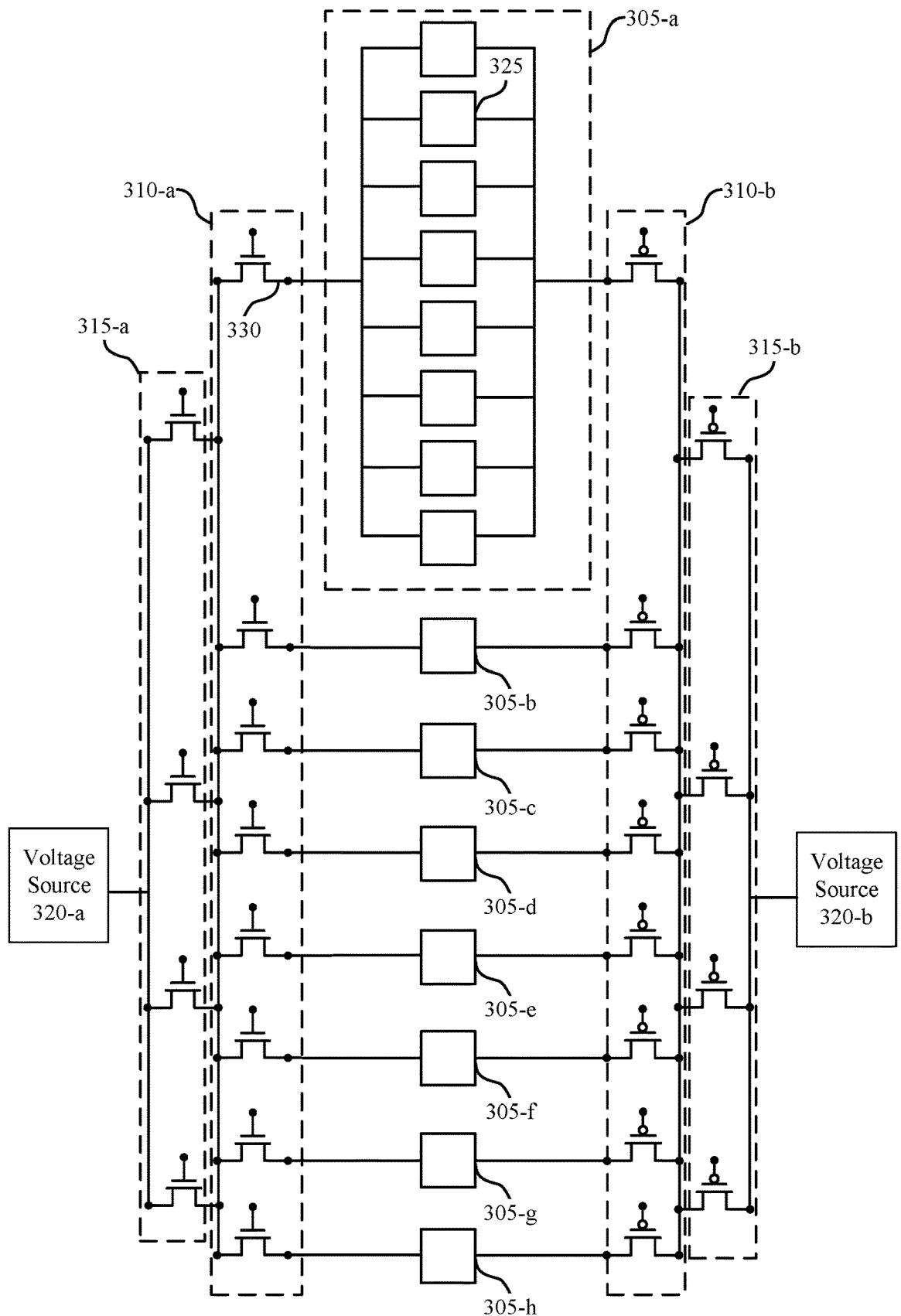
FIG. 3 illustrates an example of a decoder that supports decoder architecture for memory device in accordance with examples as disclosed herein.

Memory array 200 may also include a row line 110-a, a row line 110-b, a row line 110-c, a row line 110-d, a column line 115-a, and a column line 115-b, which may be examples of row lines 110 and column lines 115, as described with reference to FIG. 1. One or more memory cells of the first deck 205 and the second deck 210 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 205 may include one or more of an electrode 225-a, a storage element 220-a, or an electrode 225-b. One or more memory cells of the second deck 210 may include an electrode 225-c, a storage element 220-b, and an electrode 225-d. The storage elements 220 may be examples of a chalcogenide material, such as a phase change storage element, a thresholding storage element, or a self-selecting storage element. The memory cells of the first deck 205 and second deck 210 may, in some examples, have common conductive lines such that corresponding memory cells of one or more decks 205 and one or more decks 210 may share column lines 115 or row lines 110. For example, the first electrode 225-c of the second deck 210 and the second electrode 225-b of the first deck 205 may be coupled with column line 115-a such that the column line 115-a may be shared by vertically adjacent memory cells.

In some examples, the material of the storage element 220 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 220 may be an example of a phase change memory cell. In such examples, the material used in the storage element 220 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 225-*a*, storage element 220-*a*, electrode 225-*b*), the various parameters of the programming pulse may influence (e.g., determine, set, program) a particular behavior or characteristic of the material of the storage element 220, such as the threshold voltage of the material or the resistance of the material. To program a low-resistance state (e.g., a relatively crystalline state) in the phase change memory cell, a programming pulse may be applied that heats or melts the material of the storage element 220, which may be associated with forming, at least temporarily, a relatively disordered (e.g., amorphous) atomic arrangement.

The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 220. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 220 depending on the logic state stored by the material of the storage element 220 may correspond to the read window of the storage element 220. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 220 may be an example of a self-selecting memory cell. In such examples, the material used in the storage element 220 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 225-*a*, storage element 220-*a*, and electrode 225-*b*), a polarity used for a write operation may influence (determine, set, program) a particular behavior or characteristic of the material of the storage element 220, such as the threshold voltage of the material. The difference in threshold voltages of the material of the storage element 220 depending on the logic state stored by the material of the storage element 220 (e.g., the difference between the threshold voltage when the material is storing a logic state '0' versus a logic state '1') may correspond to the read window of the storage element 220.

The architecture of memory array 200 may be referred to as a cross-point architecture, in some examples, in which a memory cell is formed at a topological cross-point between a row line 110 and a column line 115. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 220 and possibly a selection element or electrode 225 may be electrically in series between a row line 110 and a column line 115 but need not be in a pillar or stack configuration).

In some examples, the row line 110 may be coupled with a first decoder (e.g., row decoder 120 as described with reference to FIG. 1). The column line 115 may be coupled with a second decoder (e.g., column decoder 125 as described with reference to FIG. 1). The decoders (e.g., the first decoder and the second decoder) may supply a positive or negative voltage to the row lines 110 and the column lines 115. The decoders may have multiple stages, e.g., three (3) stages. The row lines 110 and the column lines 115 may be coupled with the first stage. The decoder may decode a row address, or a column address received from a host device and activate a row line 110 or a column line 115 based on the decoding. In some examples, the first stage may include a first transistor that is utilized to supply the positive voltage, a second transistor that is utilized to supply the negative voltage, and a third transistor to supply the ground voltage. Additional details regarding the first, second, and third stages are described with reference to FIGS. 3 and 4.

FIG. 3 illustrates an example of a decoder 300 that supports decoder architecture for memory device in accordance with examples as disclosed herein. Decoder 300 may be an example of a row decoder (e.g., row decoder 120 as described with reference to FIG. 1) or a column decoder (e.g., column decoder 125 as described with reference to FIG. 1). The decoder 300 may include a first stage 305, a second stage 310, and a third stage 315. The decoder 300 may also include a voltage source 320-a and a voltage source 320-b.

The decoder 300 along with one or more other components of a memory device may be configured to decode a memory address in a command received from a host device and activate a memory cell (e.g., memory cell 105) associated with the memory address. For example, the memory device may be configured to receive the memory address, determine the memory cell associated with the address, and activate, using the decoder 300, a circuit 325 in the first stage 305, a transistor in the second stage 310, and a transistor in the third stage 315 to provide a voltage to an access line (e.g., a row line 110 or a column line 115 as described with reference to FIG. 1) coupled with the memory cell. Although the first stage 305, second stage 310, and third stage 315 are shown to be next to each other, in some examples, the first stage 305, second stage 310, and third stage 315 may be configured to be in different locations under a memory array including the memory cell. In some examples, a plurality of drivers for the second stage 310 and the third stage 315 may share a decoder well (e.g., a location under the memory array).

The first stage 305 may be configured to supply a voltage to the access line coupled with the memory cell to activate the memory cell. That is, each circuit 325 in a first stage 305-a may be coupled with a different access line (or plurality of access lines) and provide a negative or a positive voltage to the respective coupled access line. The decoder 300 may include a plurality of first stages 305 (e.g., 305-a through 305-h) and each first stage 305 may have eight (8) circuits 325. The first stages 305 may be coupled with a second stage 310 of the decoder. In some examples, the first stage 305 may be configured to prevent disturbances on adjacent word lines. That is, the circuit 325 may be include a clamp (e.g., a transistor) that is configured to prevent a voltage supplied to the access line coupled with the circuit 325 from affecting nearby adjacent access lines. Additional details of the circuit 325 are provided with reference to FIGS. 4A-4C.

The second stage 310 may be configured to provide a voltage to a first stage 305 to activate the first stage 305 associated with the command. For example, the decoder 300 may activate a first transistor 330 of the second stage to supply a voltage to the first stage 305. The decoder 300 may deactivate the first transistor 330 of the second stage to isolate a first stage 305-a from a voltage when an access line and memory cell associated with the first stage 305-a are untargeted (e.g., are not associated with a memory address received from the host device). In some examples, the second stage 310 may include a first portion of the second stage 310-a and a second portion of the second stage 310-b. The decoder 300 may activate the first portion of the second stage 310-a when executing a first access operation. For example, the first portion of the second stage 310-a may activate a given transistor (e.g., the first transistor 330) when a negative voltage is supplied to the first stage 305-a. In other examples, the decoder 300 may activate the second portion of the second stage 310-b when executing a second access operation. For example, the second portion of the second stage 310-b may activate a transistor when supplying a positive voltage to the first stage 305-a.

The third stage 315 may be configured to isolate or supply a voltage from voltage source 320 to the second stage 310. For example, the first portion of the third stage 315-a may be configured to activate a transistor during a first access operation to supply a negative voltage from voltage source 320-a to the first portion of the second stage 310-a (e.g., to the first transistor 330). In such examples, the second portion of the third stage 315-b may isolate the second portion of the second stage 310-b from voltage source 320-b. In other examples, the second portion of the third stage 315-b may be configured to activate a transistor during a second access operation to supply a positive voltage from voltage source 320-b to the second portion of the second stage 310-b. In such examples, the first portion of the third stage 315-a may isolate the first portion of the second stage 310-a from voltage source 320-a.

Voltage source 320-a may be configured to supply a negative voltage to the decoder 300. In some examples, the voltage supplied by voltage source 320-a may be a VNN voltage having a value of −2.6 volts. Voltage source 320-b may be configured to supply a positive voltage to the decoder 300. In some examples, the voltage supplied by voltage source 320-b may be a VPP voltage having a value of 2.6 volts.

In some examples, a memory device (e.g., memory device as described with reference to FIG. 1) may store data for a host device at memory cells (e.g., memory cells 105 as described with reference to FIG. 1). The host device may transmit access commands (e.g., read, write, or fresh commands) to the memory device. In response, the memory device may activate a memory cell associated with a memory address in the command received from the host device. The memory cell may be activated by applying a voltage to an access line coupled with the memory cell. In some examples, the memory cells may support bipolar programming (e.g., the memory cells may be written to read from using a positive or a negative voltage. The decoder 300 may supply a voltage to the access line depending on the command—e.g., the decoder 300 may provide a positive voltage or a negative voltage based on the command. The decoder 300 may also be configured to supply a ground voltage to the access line between access operations.

For example, the memory device may receive a first command associated with a first access operation on a first memory cell. In response to receiving the first command, the decoder 300 may activate a transistor of the first portion of the third stage 315-a, the first transistor 330 of the first portion of the second stage 310-a, and supply the negative voltage to the circuit 325. The decoder 300 may also deactivate some or all of the transistors in the second portion of the second stage 310-b and second portion of the third stage 315-b to isolate the circuit 325 from a positive voltage. In such examples, the memory device may apply a negative voltage to the access line coupled with the first memory cell associated with the first command.

In other examples, the memory device may receive a second command associated with a second access operation on the first memory cell. In response to receiving the second command, the decoder 300 may activate a transistor of the second portion of the third stage 315-b, a transistor of the second portion of the second stage 310-*b*, and supply the positive voltage to the circuit 325. The decoder 300 may also deactivate some or all of the transistors in the first portion of the second stage 310-*a* and the first portion of the third stage 315-*a* to isolate the circuit 325 from a negative voltage. In such examples, the memory device may apply a positive voltage to the access line coupled with the first memory cell associated with the second command.

By utilizing the architecture as described herein, the decoder 300 may be manufactured to scale down in proportion to a scaling down of the memory array. That is, in some examples it may be challenging to scale down a decoder in proportion to scaling down a memory array. For example, the memory array may utilize the same voltages while scaling down but this may cause the decoder to remain at the same size—e.g., the drivers of the decoder may not scale down as they still provide the same voltage. In other examples, a decoder 300 utilizing a high voltage may include transistors with oxide capable of isolating the high voltage from the access line. In some examples, it may be difficult to scale down the size and dimensions of the oxide while still isolating the high voltage.

As described herein, the decoder 300 may utilize smaller voltages than compared with other solutions (e.g., the magnitude of the positive and negative voltages may be reduced by half). This may enable the decoder to isolate the high voltage with smaller transistors thereby taking up less space. The decoder 300 may also have simpler routing of voltages to the access line. Additional details regarding the simpler routing is described with reference to FIGS. 4A-4C in the context of the circuit 325.

Figure 4A:
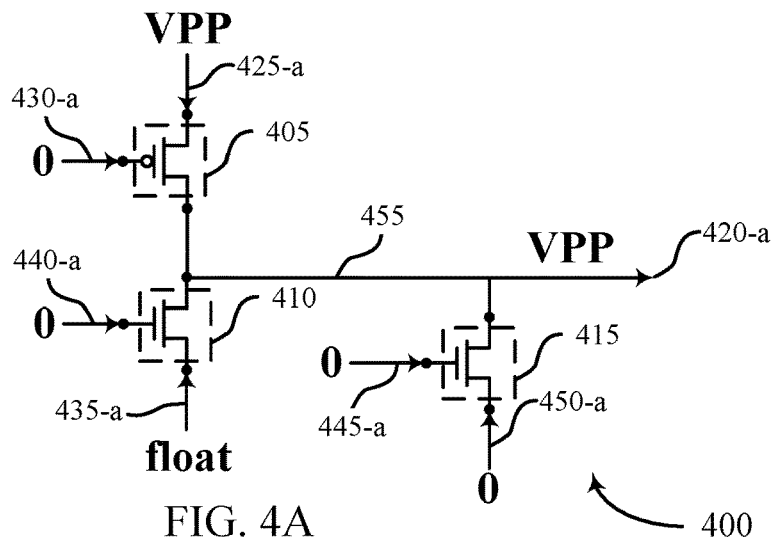
FIGS. 4A, 4B, and 4C illustrate examples of circuits that support decoder architecture for memory device in accordance with examples as disclosed herein.
Figure 4B:
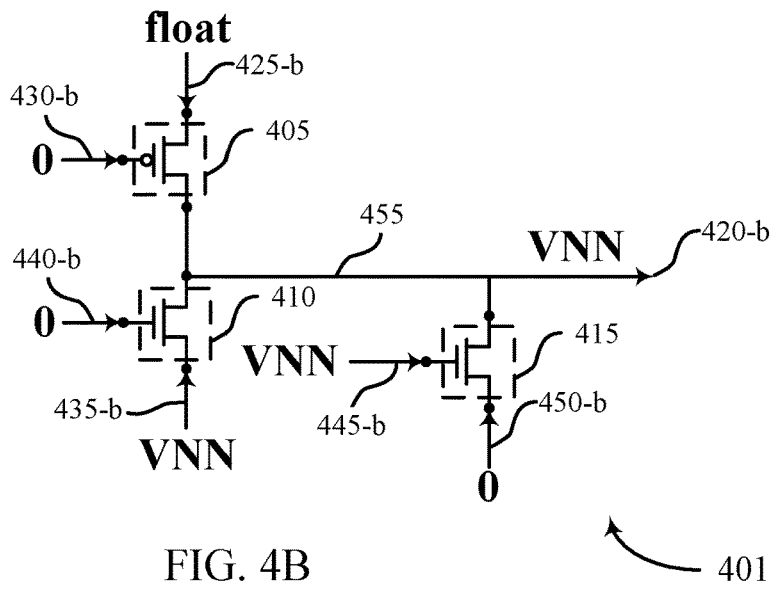
Figure 4C:
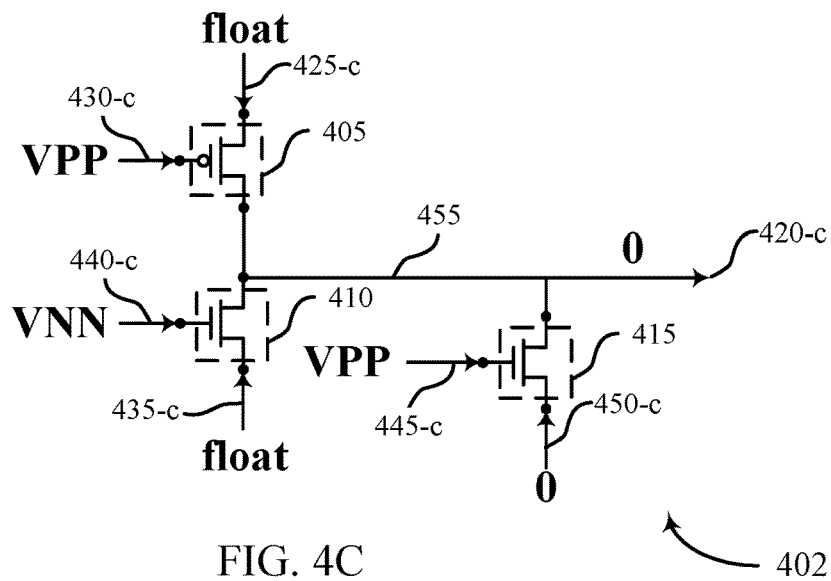

FIGS. 4A, 4B, and 4C illustrate examples of circuits 400, 401, and 402, respectively, that support decoder architecture for memory device in accordance with examples as disclosed herein. In some examples, the circuit 400 may be an example of circuit 325 as described with reference to FIG. 3. That is, the circuits 400, 401, and 402 may be examples of components of a first stage (e.g., first stage 305) of a decoder (e.g., decoder 300). FIGS. 4A, 4B, and 4C may illustrate the various voltages received and outputted by a circuit 325 during different periods (e.g., during a first access operation, a second access operation, or during a period between the first access operation and the second access operation).

FIG. 4A illustrates a circuit 400 that includes a first transistor 405, a second transistor 410, and a third transistor 415. The circuit 400 may also include an access line 455 (e.g., a row line 110 or a column line 115 as described with reference to FIG. 1). In some examples, the access line 455 may be coupled with a memory cell (e.g., memory cell 105 as described with reference to FIG. 1). The circuit 400 may be example of a circuit configuration that applies the positive voltage (VPP) to the access line 455.

In the example of circuit 400, the first transistor 405 may be configured to supply a voltage 425-*a* received at a source of the first transistor 405 to the access line 455. In other examples, the first transistor 405 may be configured to isolate the access line 455 from the voltage 425-*a*. That is, the first transistor 405 is configured to supply the voltage 425-*a* to the access line 455 when activated and isolate the voltage 425-*a* from the access line 455 when deactivated. The first transistor 405 may be an example of PMOS transistor. In such examples, the first transistor 405 may be activated when the voltage 425-*a* exceeds a sum of a voltage 430-*a* received at the gate of the first transistor 405 and a threshold voltage of the first transistor 405. In some examples, the first transistor 405 may be coupled with a second stage of the decoder (e.g., second portion of the second stage 310-*b* as described with reference to FIG. 3). That is, the voltage 425-*a* at the source of the first transistor 405 may be received from the second portion of the second stage. In circuit 400, a ground voltage may be applied to the gate of the first transistor 405 and the positive voltage (VPP) may be applied to the source of the first transistor 405. The difference between the positive voltage and the ground voltage may exceed the threshold voltage of the first transistor 405 thereby activating the first transistor 405.

In the example of circuit 400, the second transistor 410 may be configured to isolate the access line 455 from the voltage 435-*a*. In other examples, the second transistor 410 may be configured to supply a voltage 435-*a* received at a source of the second transistor 410 to the access line 455. That is, the second transistor 410 is configured to supply the voltage 435-*a* to the access line 455 when activated and isolate the voltage 435-*a* from the access line 455 when deactivated. The second transistor 410 may be an example of an NMOS transistor. In such examples, the second transistor 410 may be activated when a voltage 440-*a* at a gate of the second transistor 410 exceeds a sum of the voltage 435-*a* and a threshold voltage of the second transistor 410. In some examples, the second transistor 410 may be coupled with a second stage of the decoder (e.g., first portion of the second stage 310-*a* as described with reference to FIG. 3). That is, the voltage 435-*a* at the source of the first transistor 405 may be received from the first portion of the second stage. In circuit 400, a ground voltage may be applied to the gate of the second transistor 410 and the source of the second transistor 410 may be floated (e.g., it may be isolated from one or more voltage sources by the second stage of the decoder). The difference between the positive voltage and the ground voltage may be less than the threshold voltage of the second transistor 410 thereby leaving the second transistor 410 deactivated.

The third transistor may be configured to supply a voltage 450-*a* (e.g., a ground voltage) received at a source of the third transistor 415 to the access line 455. In other examples, the third transistor 415 may be configured to isolate the voltage 450-*a* from the access line 455. In some examples, the third transistor 415 may be configured to prevent adjacent access lines (not shown) from experiencing disturbances. That is, the third transistor 415 may be configured as a clamp when the access line is not be accessed. The third transistor 415 may be an example of an NMOS transistor. During an operation, as shown in circuit 400, the third transistor 415 may be in a deactivated state based on applying a ground voltage to the gate of the third transistor 415.

The access line 455 may be configured to drive a voltage 420-*a* to the memory cell coupled with the access line 455. In some examples, the access line 455 may be configured to activate the memory cell. In the example of circuit 400, the voltage 420-*a* may be an example of the positive voltage (VPP).

In some examples, scaling down the decoder and the circuit 400 in proportion to the scaling down of the memory array may be challenging. For example, it may be difficult to scale down the decoder and circuit 400 while still providing an adequate voltage to the memory array. That is, a memory device utilizing a high voltage may include transistors with oxide capable of isolating the high voltage from the access line. In some examples, it may be difficult to scale down the size and dimensions of the oxide while still isolating the high voltage. Additionally, in some examples, it may be difficult to design decoders that scale down in proportion to the memory array and prevent disturbances on adjacent access lines. In other examples, the complexity of the decoder may make it more difficult to scale down.

The circuit 400 may enable the decoder to scale down in proportion to the memory array. For example, the decoder and circuit 400 may utilize a voltage that is smaller when compared with other solutions (e.g., reducing the voltage by half). Additionally, the circuit 400 may simplify the routing of voltages to the access line as the circuit 400 is configured to provide a positive, negative, or ground voltage to the access line—e.g., a single circuit 400 may be utilized to provide the voltages to an access line. In some examples, the circuit 400 may also reduce excess power consumption. For example, the first transistor 405, second transistor 410, or third transistor 415 may sometimes be activated or deactivated by existing voltages supplied to the source of each transistor rather than activating each transistor each time by a supplying a voltage to the gate. The third transistor 415 may also clamp the access line 455 and prevent disturbances on adjacent access line.

In some examples, the memory device may receive a first command associated with a first access operation. The decoder may decode the first command and activate a transistor in the second portion of the third stage (e.g., the second portion of the third stage 315-b as described with reference to FIG. 3) and activate a second transistor in the second portion of the second stage. Accordingly, the circuit 400 may supply the first transistor 405 with a positive voltage 425-a at the source of the first transistor 405 from a first voltage source (e.g., voltage source 320-b as described with reference to FIG. 3). The circuit 400 may also supply a voltage 430-a at a gate of the first transistor 405 having a value of zero (0) volts. That is, the gate of the first transistor 405 may be refrained from being supplied a voltage. In such examples, the voltage 425-a may exceed the sum of voltage 430-a and the threshold voltage of the first transistor 405, activating the first transistor 405. Additionally, the decoder may deactivate some or all of the transistors in the first portion of the third stage (e.g., the second portion of the third stage 315-a as described with reference to FIG. 3) and the first portion of the second stage. Accordingly, the circuit 400 may cause the source of the second transistor 410 to be floated (e.g., it may be isolated from one or more voltage sources) by the second stage. That is, the second transistor 410 may be isolated from a second voltage source (e.g., 320-a) and receive the voltage 435-a that floats on a supply line coupling the second transistor 410 to the second stage. The second transistor 410 may also be supplied with a voltage 440-a at the gate of the second transistor 410 having a value of zero (0) volts. In such examples, the voltage 440-a may be less than a sum of the voltage 435-a and the threshold voltage of the second transistor 410, deactivating the second transistor 410 and isolating the access line 455 from the voltage from the second voltage source.

Additionally or alternatively, the circuit 400 may supply a ground voltage 450-a at a source of the third transistor 415. The third transistor 415 may be supplied with a voltage 445-a at the gate of third transistor having a value of zero (0) volts. In such examples, the voltage 445-a may be less than the sum of the voltage 450-a and a threshold voltage of the third transistor deactivating the third transistor 415. Accordingly, during the first access operation, the circuit 400 may drive the access line 455 to a positive voltage 420-a that is the same as the voltage 425-a received at the source of the first transistor 405. In some examples, the first command may be referred to as a select high operation. In such examples, the voltage 420-a may have a value of 2.6 volts to activate the memory cell coupled with the access line 455.

FIG. 4B illustrates an example of a circuit 401 when the memory device receives a second command. For example, the memory device may receive the second command associated with a second access operation. The circuit 401 may be example of a circuit configuration that applies the negative voltage (VNN) to the access line 455.

The decoder may decode the second command and activate a transistor in the first portion of the third stage (e.g., the first portion of the third stage 315-a as described with reference to FIG. 3) and activate a second transistor in the first portion of the second stage. Accordingly, the circuit 401 may supply a negative voltage 435-b at the source of the second transistor 410 from the second voltage source. The circuit 401 may also supply the second transistor 410 with a voltage 440-b at the gate of the second transistor 410 having a value of zero (0) volts. That is, the gate of the second transistor 410 may be refrained from being supplied a voltage. In such examples, the voltage 440-b may exceed the sum of voltage 435-b and the threshold voltage of the second transistor 410 activating the second transistor 410.

Additionally, the decoder may deactivate some or all of the transistors in the second portion of the third stage and the second portion of the second stage. Accordingly, circuit 401 may cause the source of the first transistor 405 to be floated (e.g., it may be isolated from one or more voltage sources) by the second stage. That is, the first transistor 405 may be isolated from the first voltage source and receive the voltage 425-b that floats on a routing line coupling the first transistor 405 to the second stage. The circuit 401 may also supply a voltage 430-b at a gate of the first transistor 405 having a value of zero (0) volts. In such examples, the voltage 425-b may be less than a sum of the voltage 430-a and the threshold voltage of the first transistor 405, deactivating the first transistor 405 and isolating the access line 455 from the voltage from the first voltage source.

Additionally, the circuit 401 may supply a ground voltage 450-b at the source of the third transistor 415. The circuit 401 may supply a voltage 445-b at the gate of third transistor having a value of zero (0) volts. In such examples, the voltage 445-b may be less than the sum of the voltage 450-b and the threshold voltage of the third transistor, deactivating the third transistor 415. Accordingly, during the second access operation, the circuit 401 may drive the access line 455 to a negative voltage 420-b that is the same as the voltage 435-b received at the source of the second transistor 410. In some examples, the second command may be referred to as a select low operation. In such examples, the voltage 420-b may have a value of −2.6 volts to activate the memory cell coupled with the access line 455.

FIG. 4C illustrates an example of a circuit 402 when the memory device is an idle state—e.g., during a period between the first access operation and the second access operation. The circuit 402 may be example of a circuit configuration that applies a ground to the access line 455 (e.g., when the access line is not a target access line during an operation). That is, during a period where an access operation is not being performed, the access line 455 may be in the idle state. The decoder may deactivate some or all transistors in the second stage and the third stage. Accordingly, the circuit 402 may cause the source of the first transistor 405 and the source of the second transistor 410 to be floated (e.g., it may be isolated from one or more voltage sources) by the second stage. While the memory device is an idle state, the circuit 402 may provide a voltage to the gates of the first transistor 405 and the second transistor 410. For example, the circuit 402 may supply a positive voltage 430-c the gate of the first transistor 405 and a negative voltage 440-c may the gate of the second transistor 410. In such examples, the voltage 425-c may be less than a sum of the voltage 430-a and the threshold voltage of the first transistor 405, deactivating the first transistor 405. Additionally, the voltage 440-c may be less than a sum of the voltage 435-c and the threshold voltage of the second transistor 410, deactivating the second transistor 410.

The circuit 402 may also supply a positive voltage 445-c to the gate of the third transistor 415. The third transistor 415 may also receive a ground voltage 450-c at the source of third transistor 415. In such examples, the voltage 445-c may exceed a sum of the voltage 450-c and the threshold voltage of the third transistor 415, activating the third transistor 415. Accordingly, while the memory device is idle, the third transistor 415 may couple a ground voltage source to the access line 455, grounding the access line 455 and driving the ground voltage 420-c to the memory cell coupled with the access line 455.

That is, the memory device may receive a first command associated with a select high operation. In response to the command, the decoder may activate a transistor in the second portion of the third stage and a transistor in the second stage to bias the source of the first transistor 405 with a positive voltage 425-a from the first voltage source. During the execution of the first command, the decoder may also deactivate some or all of the transistors in the first portion of the third stage and the first portion of the second stage to cause the source of the second transistor to float and thereby deactivate the second transistor 410. Accordingly, the circuit 402 may activate the first transistor 405 to supply the access line 455 with the positive voltage 420-a during the first access operation.

When the memory device receives the second command associated with the select low operation, the decoder may activate a transistor in the first portion of the third stage and a transistor in the first portion of the second stage to bias the source of the second transistor 410 with a negative voltage from the second voltage source. During the execution of the second command, the decoder may also deactivate some or all of the transistors in the second portion of the second stage and the second portion of the third stage to cause the source of the first transistor 405 to float and thereby to deactivate the first transistor 405. Accordingly, the circuit 402 may activate the second transistor 410 to supply the access line 455 with the negative voltage 420-b during the second access operation.

When the memory device has executed the first command or the second command, the decoder may deactivate some or all of the transistors in the first stage and the second stage to cause the source of the first transistor 405 to float and the source of the second transistor 410 to float. The circuit 402 may also supply the voltage 430-c to the gate of the first transistor 405 and supply the voltage 440-c to the gate of the second transistor 410. Accordingly, the circuit 402 may deactivate the first transistor 405 and the second transistor 410. Additionally, the circuit 402 may supply the voltage 445-c to the gate of the third transistor 415 to activate the third transistor 415. In such examples, the third transistor 415 may couple the ground voltage 450-c from the ground voltage source to the access line 455.

Figure 5:
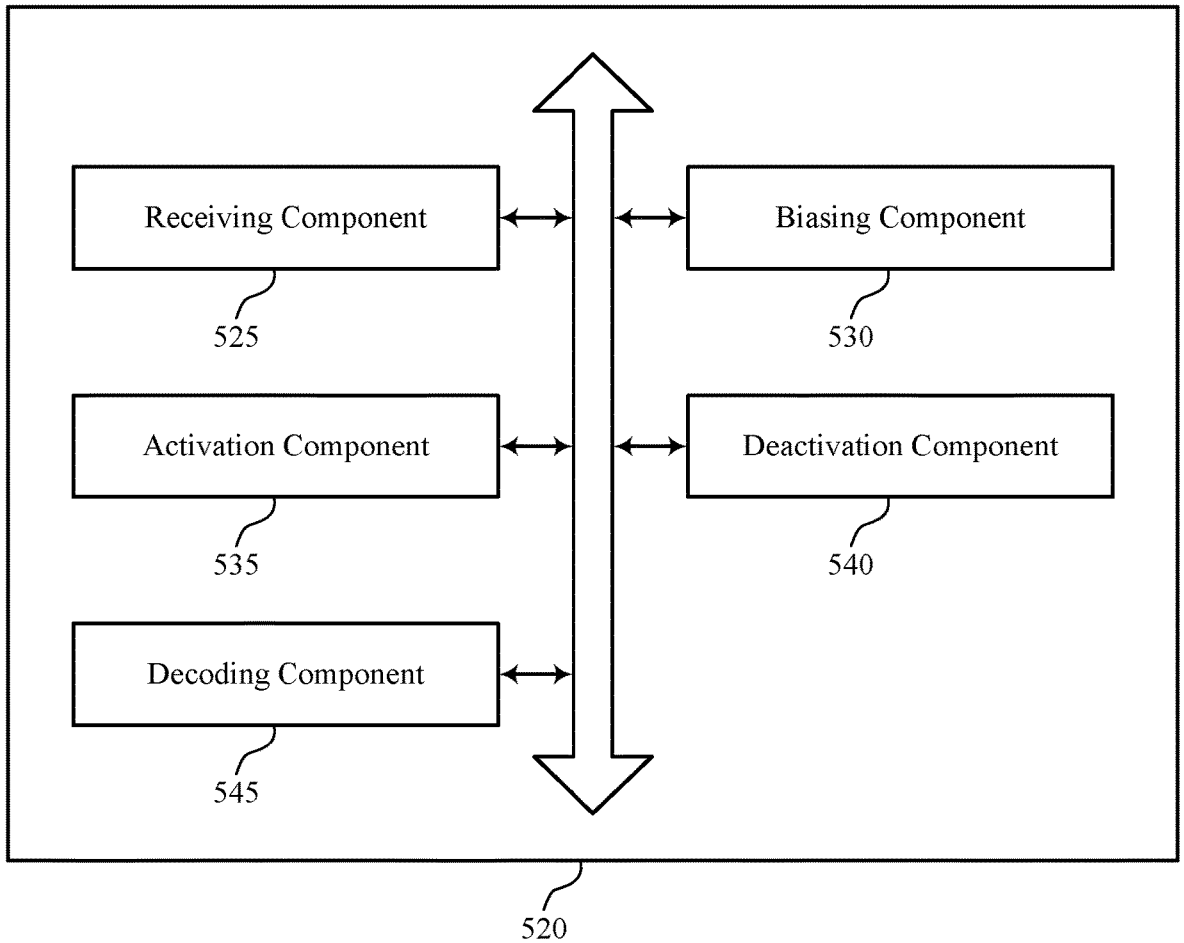
FIG. 5 shows a block diagram of a memory device that supports decoder architecture for memory device in accordance with examples as disclosed herein.

FIG. 5 shows a block diagram 500 of a memory device 520 that supports decoder architecture for memory device in accordance with examples as disclosed herein. The memory device 520 may be an example of aspects of a memory device as described with reference to FIGS. 1-4. The memory device 520, or various components thereof, may be an example of means for performing various aspects of decoder architecture for memory device as described herein. For example, the memory device 520 may include a receiving component 525, a biasing component 530, an activation component 535, a deactivation component 540, a decoding component 545, or any combination thereof. Each of these components may communicate, directly or indirectly, with one another (e.g., via one or more buses).

The receiving component 525 may be configured as or otherwise support a means for receiving a command associated with a memory cell coupled with an access line. In some examples, the receiving component 525 may be configured as or otherwise support a means for receiving a second command associated with the memory cell coupled with the access line.

The biasing component 530 may be configured as or otherwise support a means for biasing, by a first stage of a decoder, a source of a first transistor to a first voltage exceeding a second voltage of a gate of the first transistor and a first threshold voltage of the first transistor to activate the first transistor based at least in part on receiving the command, where a second stage of the decoder includes the first transistor. In some examples, the biasing component 530 may be configured as or otherwise support a means for biasing, by the first stage of the decoder, a source of a second transistor to a third voltage to deactivate the second transistor based at least in part on receiving the command, where a fourth voltage of a gate of the second transistor is less than the second voltage and a second threshold voltage of the second transistor, and where the second stage of the decoder includes the second transistor. In some cases, the biasing component 530 may be configured as or otherwise support a means for supplying a positive voltage to the access line based at least in part on biasing the source of the first transistor and biasing the source of the second transistor.

In some instances, the biasing component 530 may be configured as or otherwise support a means for biasing, by the first stage of the decoder, the source of the first transistor to a fifth voltage less than the second voltage of the gate of the first transistor and the first threshold voltage of the first transistor to deactivate the first transistor based at least in part on the command. In some examples, the biasing component 530 may be configured as or otherwise support a means for biasing, by the first stage of the decoder, the source of the second transistor to a sixth voltage, where the fourth voltage of the gate of the second transistor exceeds the sixth voltage and the second threshold voltage of the second transistor, to activate the second transistor based at least in part on receiving the command. In some cases, the biasing component 530 may be configured as or otherwise support a means for supplying a negative voltage to the access line based at least in part on biasing the source of the first transistor and biasing the source of the second transistor.

In some examples, the biasing component 530 may be configured as or otherwise support a means for biasing, after executing the command, the gate of the first transistor to a fifth voltage to deactivate the first transistor, where the fifth voltage and the first threshold voltage of the first transistor is less than a sixth voltage at the source of the first transistor. In some cases, the biasing component 530 may be configured as or otherwise support a means for biasing, after executing the command, the gate of the second transistor to a seventh voltage to deactivate the second transistor, where the seventh voltage is less than the third voltage at the source of the second transistor and the second threshold voltage of the second transistor. In some instances, the biasing component 530 may be configured as or otherwise support a means for isolating the access line from the positive voltage or a negative voltage based at least in part on biasing the gate of the first transistor and biasing the gate of the second transistor.

In some instances, the biasing component 530 may be configured as or otherwise support a means for biasing, after executing the command, a gate of a third transistor to the fifth voltage that exceeds an eighth voltage at a source of the third transistor and a third threshold voltage of the third transistor, where the second stage of the decoder includes the third transistor. In some examples, the biasing component 530 may be configured as or otherwise support a means for supplying the eighth voltage to the access line based at least in part on biasing the gate of the third transistor. In some cases, the biasing component 530 may be configured as or otherwise support a means for supplying the sixth voltage as a ground voltage associated with a reset operation.

In some cases, the biasing component 530 may be configured as or otherwise support a means for supplying the second voltage to the gate of the first transistor such that the second voltage of the gate of the first transistor exceeds a sum of the first voltage and the first threshold voltage of the first transistor. In some examples, the biasing component 530 may be configured as or otherwise support a means for supplying the fourth voltage to the gate of the second transistor such that the fourth voltage of the gate of the second transistor is less than a sum of the second voltage and the second threshold voltage of the second transistor.

In some examples, the activation component 535 may be configured as or otherwise support a means for activating a third transistor of the first stage of the decoder based at least in part on receiving the command, the third transistor coupled with the first transistor and a fourth transistor of a third stage of the decoder. In some cases, the activation component 535 may be configured as or otherwise support a means for activating the fourth transistor of the third stage to couple the third transistor of the first stage with a voltage source that supplies the positive voltage, where the source of the first transistor is biased based at least in part on activating the third transistor and activating the fourth transistor.

In some instances, the deactivation component 540 may be configured as or otherwise support a means for deactivating a third transistor of the first stage of the decoder based at least in part on the receiving the command, the third transistor coupled with the second transistor and a fourth transistor of a third stage of the. In some cases, the deactivation component 540 may be configured as or otherwise support a means for deactivating the fourth transistor of the third stage to decouple the third transistor from a voltage source that supplies a negative voltage, where the source of the second transistor is biased based at least in part on deactivating the third transistor and deactivating the fourth transistor.

In some instances, the decoding component 545 may be configured as or otherwise support a means for decoding a memory address associated with the command, where biasing the source of the first transistor and the source of the second transistor of the second stage is based at least in part on decoding the memory address.

Figure 6:
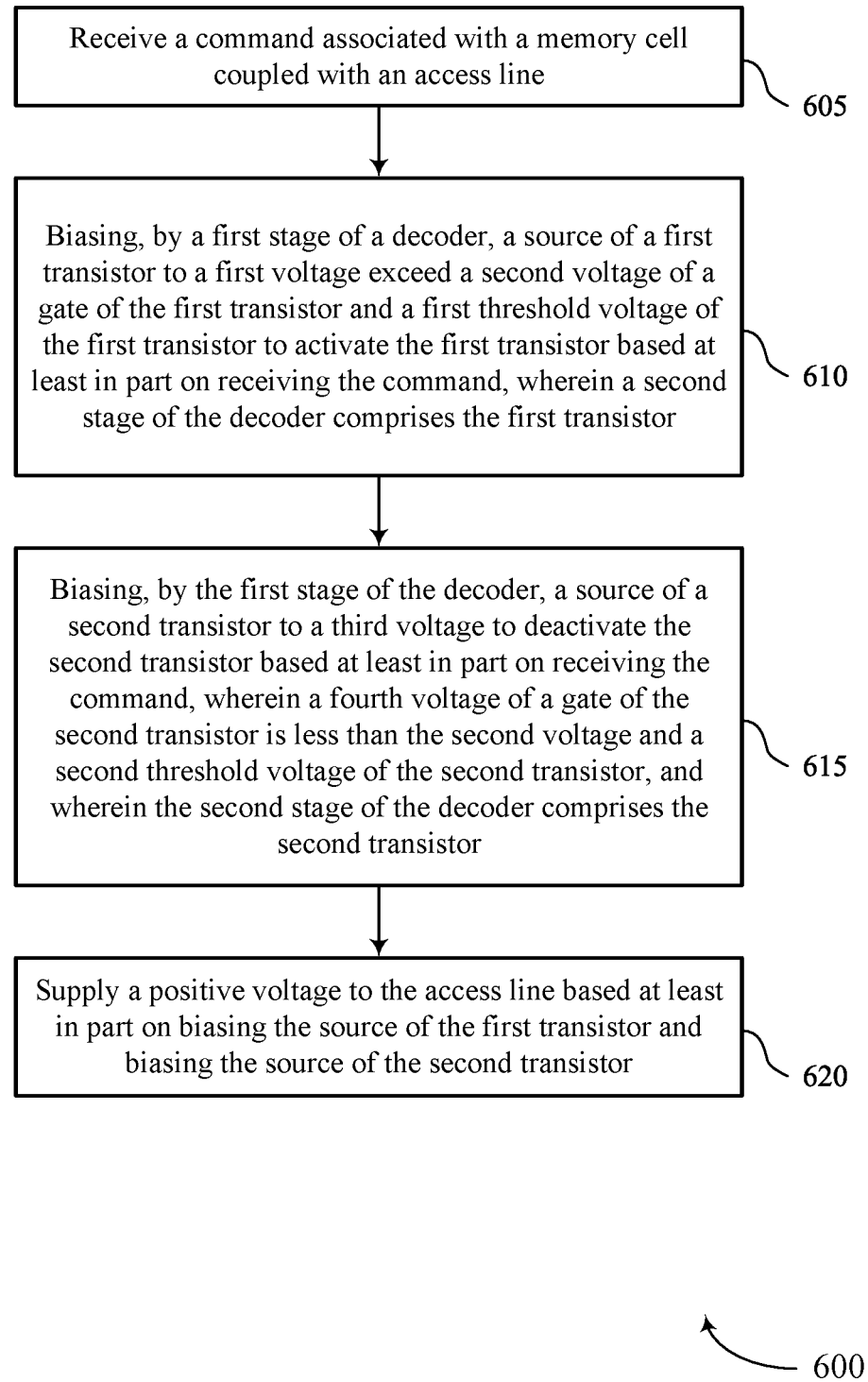
FIG. 6 shows a flowchart illustrating a method or methods that support decoder architecture for memory device in accordance with examples as disclosed herein.

FIG. 6 shows a flowchart illustrating a method 600 that supports decoder architecture for memory device in accordance with examples as disclosed herein. The operations of method 600 may be implemented by a memory device or its components as described herein. For example, the operations of method 600 may be performed by a memory device as described with reference to FIGS. 1-5. In some examples, a memory device may execute a set of instructions to control the functional elements of the device to perform the described functions. Additionally or alternatively, the memory device may perform aspects of the described functions using special-purpose hardware.

At 605, the method may include receiving a command associated with a memory cell coupled with an access line. The operations of 605 may be performed in accordance with examples as disclosed herein. In some examples, aspects of the operations of 605 may be performed by a receiving component 525 as described with reference to FIG. 5.

At 610, the method may include biasing, by a first stage of a decoder, a source of a first transistor to a first voltage exceeding a second voltage of a gate of the first transistor and a first threshold voltage of the first transistor to activate the first transistor based at least in part on receiving the command, where a second stage of the decoder includes the first transistor. The operations of 610 may be performed in accordance with examples as disclosed herein. In some examples, aspects of the operations of 610 may be performed by a biasing component 530 as described with reference to FIG. 5.

At 615, the method may include biasing, by the first stage of the decoder, a source of a second transistor to a third voltage to deactivate the second transistor based at least in part on receiving the command, where a fourth voltage of a gate of the second transistor is less than the second voltage and a second threshold voltage of the second transistor, and where the second stage of the decoder includes the second transistor. The operations of 615 may be performed in accordance with examples as disclosed herein. In some examples, aspects of the operations of 615 may be performed by a biasing component 530 as described with reference to FIG. 5.

At 620, the method may include supplying a positive voltage to the access line based at least in part on biasing the source of the first transistor and biasing the source of the second transistor. The operations of 620 may be performed in accordance with examples as disclosed herein. In some examples, aspects of the operations of 620 may be performed by a biasing component 530 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving a command associated with a memory cell coupled with an access line, biasing, by a first stage of a decoder, a source of a first transistor to a first voltage exceeding a second voltage of a gate of the first transistor and a first threshold voltage of the first transistor to activate the first transistor based at least in part on receiving the command, where a second stage of the decoder includes the first transistor, biasing, by the first stage of the decoder, a source of a second transistor to a third voltage to deactivate the second transistor based at least in part on receiving the command, where a fourth voltage of a gate of the second transistor is less than the second voltage and a second threshold voltage of the second transistor, and where the second stage of the decoder includes the second transistor, and supplying a positive voltage to the access line based at least in part on biasing the source of the first transistor and biasing the source of the second transistor.

Some instances of the method 600 and the apparatus described herein may further include operations, features, circuitry, logic, means, or instructions for receiving a second command associated with the memory cell coupled with the access line, biasing, by the first stage of the decoder, the source of the first transistor to a fifth voltage less than the second voltage of the gate of the first transistor and the first threshold voltage of the first transistor to deactivate the first transistor based at least in part on the command, biasing, by the first stage of the decoder, the source of the second transistor to a sixth voltage, where the fourth voltage of the gate of the second transistor exceeds the sixth voltage and the second threshold voltage of the second transistor, to activate the second transistor based at least in part on receiving the command, and supplying a negative voltage to the access line based at least in part on biasing the source of the first transistor and biasing the source of the second transistor.

In some cases of the method 600 and the apparatus described herein, biasing, after executing the command, the gate of the first transistor to a fifth voltage to deactivate the first transistor, where the fifth voltage and the first threshold voltage of the first transistor may be less than a sixth voltage at the source of the first transistor, biasing, after executing the command, the gate of the second transistor to a seventh voltage to deactivate the second transistor, where the seventh voltage may be less than the third voltage at the source of the second transistor and the second threshold voltage of the second transistor, and isolating the access line from the positive voltage or a negative voltage based at least in part on biasing the gate of the first transistor and biasing the gate of the second transistor.

In some examples of the method 600 and the apparatus described herein, biasing, after executing the command, a gate of a third transistor to the fifth voltage that exceeds an eighth voltage at a source of the third transistor and a third threshold voltage of the third transistor, where the second stage of the decoder includes the third transistor and supplying the eighth voltage to the access line based at least in part on biasing the gate of the third transistor.

In some instances of the method 600 and the apparatus described herein, the sixth voltage may be a ground voltage associated with a reset operation.

Some cases of the method 600 and the apparatus described herein may further include operations, features, circuitry, logic, means, or instructions for activating a third transistor of the first stage of the decoder based at least in part on receiving the command, the third transistor coupled with the first transistor and a fourth transistor of a third stage of the decoder and activating the fourth transistor of the third stage to couple the third transistor of the first stage with a voltage source that supplies the positive voltage, where the source of the first transistor may be biased based at least in part on activating the third transistor and activating the fourth transistor.

Some examples of the method 600 and the apparatus described herein may further include operations, features, circuitry, logic, means, or instructions for deactivating a third transistor of the first stage of the decoder based at least in part on the receiving the command, the third transistor coupled with the second transistor and a fourth transistor of a third stage of the and deactivating the fourth transistor of the third stage to decouple the third transistor from a voltage source that supplies a negative voltage, where the source of the second transistor may be biased based at least in part on deactivating the third transistor and deactivating the fourth transistor.

Some instances of the method 600 and the apparatus described herein may further include operations, features, circuitry, logic, means, or instructions for decoding a memory address associated with the command, where biasing the source of the first transistor and the source of the second transistor of the second stage may be based at least in part on decoding the memory address.

In some cases of the method 600 and the apparatus described herein, the second voltage of the gate of the first transistor exceeds a sum of the first voltage and the first threshold voltage of the first transistor and the fourth voltage of the gate of the second transistor may be less than a sum of the second voltage and the second threshold voltage of the second transistor.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a memory array including a memory cell and an access line coupled with the memory cell and a decoder including a first stage and a second stage, the decoder configured to supply a first voltage during a first access operation and a second voltage during a second access operation to the access line, the second stage of the decoder including a first transistor configured to supply the first voltage to the access line during the first access operation based at least in part on a third voltage at a source of the first transistor exceeding a fourth voltage at a gate of the first transistor and a first threshold voltage of the first transistor and a second transistor configured to supply the second voltage to the access line during the second access operation based at least in part on a fifth voltage at a gate of the second transistor exceeding a sixth voltage at a source of the second transistor and a second threshold voltage of the second transistor In some instances of the apparatus, the second transistor may be configured to isolate a voltage source of the second voltage from the access line during the first access operation based at least in part on the fifth voltage at the gate of the second transistor being less than a seventh voltage at the source of the second transistor and the second threshold voltage of the second transistor.

In some cases of the apparatus, the first transistor may be configured to isolate a voltage source of the first voltage from the access line during the second access operation based at least in part on a seventh voltage at the source of the first transistor being less than the fourth voltage at the gate of the first transistor and the first threshold voltage of the first transistor.

In some examples of the apparatus, the decoder may be further configured to supply a seventh voltage to the access line between a portion of a duration between performing access operations associated with the access line, the first transistor may be configured to isolate a first voltage supply of the first voltage from the access line during the portion of the duration based at least in part on an eighth voltage at the source of the first transistor being less than a ninth voltage at the gate of the first transistor and the first threshold voltage of the first transistor, and the second transistor may be configured to isolate a second voltage supply of the second voltage from the access line during the portion of the duration based at least in part on a tenth voltage at the gate of the second transistor being less than an eleventh voltage at the source of the second transistor and the second threshold voltage of the second transistor.

In some instances of the apparatus, a third transistor configured to supply the seventh voltage to the access line during the portion of the duration based at least in part on the ninth voltage at the gate of the third transistor exceeding the seventh voltage at a source of the third transistor and a third threshold voltage of the third transistor.

In some cases of the apparatus, the first stage of the decoder further includes a first portion configured to supply the first voltage to the access line, the first portion including a third transistor coupled with a first voltage source configured to supply the first voltage and a first node, and a fourth transistor coupled with the first node and the second stage of the decoder, where the third transistor and the fourth transistor may be configured to activate during the first access operation and a second portion configured to supply the second voltage to the access line, the second portion including a fifth transistor coupled with a second voltage source configured to supply the second voltage and a second node and a sixth transistor coupled with the second node and the second stage of the decoder, where the fifth transistor and the sixth transistor may be configured to activate during the second access operation.

In some examples of the apparatus, a plurality of second stages each coupled with a third transistor of the first stage and a fourth transistor of the second stage, each second stage of the plurality of second stages coupled with an access line of a plurality of access lines, the plurality of second stages including the second stage and the plurality of access lines including the access line.

In some cases of the apparatus, a fifth transistor of a third stage of the decoder, the fifth transistor coupled with a first voltage source configured to supply the first voltage to the third transistor of the first stage of the decoder, where the decoder may be configured to activate the first transistor of the second stage, the third transistor of the first stage, and fifth transistor third stage to supply the first voltage to the access line during the first access operation and a sixth transistor of the third stage of the decoder, the sixth transistor coupled with a second voltage source configured to supply the second voltage to the fourth transistor of the first stage of the decoder, where the decoder may be configured to activate the second transistor of the second stage, the fourth transistor of the first stage, and the sixth transistor of the first stage to supply the second voltage to the access line during the second access operation.

In some instances of the apparatus, transistors of the first stage, the second stage, and the third stage of the decoder may be activated based at least in part on receiving a memory address associated with the memory cell during the first access operation.

In some examples of the apparatus, the first voltage may be a positive voltage and the second voltage may be a negative voltage.

In some cases of the apparatus, the first transistor may be a PMOS transistor and the second transistor may be a nNMOS transistor.

Another apparatus is described. The apparatus may include a memory array including a memory cell and an access line coupled with the memory cell, a decoder including a first stage and a second stage, the second stage including a first transistor and a second transistor, and a controller coupled with the memory array and the decoder and configured to receive a command associated with the memory cell coupled with an access line, bias, by the first stage of a decoder, a source of the first transistor to a first voltage exceeding a second voltage of a gate of the first transistor and a first threshold voltage of the first transistor to activate the first transistor based at least in part on receiving the command, where the second stage of the decoder includes the first transistor, bias, by the first stage of the decoder, a source of the second transistor to a third voltage to deactivate the second transistor based at least in part on receiving the command, where a fourth voltage of a gate of the second transistor is less than the second voltage and a second threshold voltage of the second transistor, and where the second stage of the decoder includes the second transistor, and supply a positive voltage to the access line based at least in part on biasing the source of the first transistor and biasing the source of the second transistor In some examples of the apparatus, the controller may be further configured to receive a second command associated with the memory cell coupled with the access line, bias, by the first stage of the decoder, the source of the first transistor to a fifth voltage less than the second voltage of the gate of the first transistor and the first threshold voltage of the first transistor to deactivate the first transistor based at least in part on the command, bias, by the first stage of the decoder, the source of the second transistor to a sixth voltage, where the fourth voltage of the gate of the second transistor exceeds the sixth voltage and the second threshold voltage of the second transistor, to activate the second transistor based at least in part on receiving the command, and supply a negative voltage to the access line based at least in part on biasing the source of the first transistor and biasing the source of the second transistor.

In some cases of the apparatus, the controller may be further configured to bias, after executing the command, the gate of the first transistor to a fifth voltage to deactivate the first transistor, where the fifth voltage and the first threshold voltage of the first transistor may be less than a sixth voltage at the source of the first transistor, bias, after executing the command, the gate of the second transistor to a seventh voltage to deactivate the second transistor, where the seventh voltage may be less than the third voltage at the source of the second transistor and the second threshold voltage of the second transistor, and isolate the access line from the positive voltage or a negative voltage based at least in part on biasing the gate of the first transistor and biasing the gate of the second transistor.

In some examples of the instances, the controller may be further configured to bias, after executing the command, a gate of the third transistor to the fifth voltage that exceeds an eighth voltage at a source of the third transistor and a third threshold voltage of the third transistor and supply the eighth voltage to the access line based at least in part on biasing the gate of the third transistor.

In some examples of the apparatus, a third transistor of the first stage of the decoder, a fourth transistor of a third stage of the decoder, and a voltage source that supplies the positive voltage, where the controller may be further configured to.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. An apparatus, comprising:
 a memory array comprising an access line coupled with a memory cell; and
 a decoder configured to supply a first voltage and a second voltage to the access line, the decoder comprising:
  a first portion configured to supply the first voltage to the access line, the first portion comprising a third transistor coupled with a first voltage source configured to supply the first voltage and a first node, and a fourth transistor coupled with the first node;
  a second portion configured to supply the second voltage to the access line, the second portion comprising a fifth transistor coupled with a second voltage source configured to supply the second voltage and a second node and a sixth transistor coupled with the second node;
  a first transistor configured to supply the first voltage to the access line based at least in part on a third voltage at a source of the first transistor exceeding a fourth voltage at a gate of the first transistor and a first threshold voltage of the first transistor; and
  a second transistor configured to supply the second voltage to the access line based at least in part on a fifth voltage at a gate of the second transistor exceeding a sixth voltage at a source of the second transistor and a second threshold voltage of the second transistor.

2. The apparatus of claim 1, wherein:
 the second transistor is configured to isolate a voltage source of the second voltage from the access line based at least in part on the fifth voltage at the gate of the second transistor being less than a seventh voltage at the source of the second transistor and the second threshold voltage of the second transistor.

3. The apparatus of claim 1, wherein:
 the first transistor is configured to isolate a voltage source of the first voltage from the access line based at least in part on a seventh voltage at the source of the first transistor being less than the fourth voltage at the gate of the first transistor and the first threshold voltage of the first transistor.

4. The apparatus of claim 1, wherein:
 the decoder is further configured to supply a seventh voltage to the access line;
 the first transistor is configured to isolate a first voltage supply of the first voltage from the access line based at least in part on an eighth voltage at the source of the first transistor being less than a ninth voltage at the gate of the first transistor and the first threshold voltage of the first transistor; and
 the second transistor is configured to isolate a second voltage supply of the second voltage from the access line based at least in part on a tenth voltage at the gate of the second transistor being less than an eleventh voltage at the source of the second transistor and the second threshold voltage of the second transistor.

5. The apparatus of claim 4, further comprising:
 the third transistor configured to supply the seventh voltage to the access line based at least in part on the ninth voltage at the gate of the third transistor exceeding the seventh voltage at a source of the third transistor and a third threshold voltage of the third transistor.

6. The apparatus of claim 1, wherein the first transistor is a p-type metal-oxide-semiconductor (PMOS) transistor and the second transistor is a n-type metal-oxide-semiconductor (NMOS) transistor.

7. A method, comprising:
 biasing a first transistor to a first voltage exceeding a second voltage of the first transistor and a first threshold voltage of the first transistor to activate the first transistor based at least in part on receiving a command, wherein the second voltage of the first transistor exceeds a sum of the first voltage and the first threshold voltage of the first transistor;
biasing a second transistor to a third voltage to deactivate the second transistor, wherein a fourth voltage of the second transistor is less than the second voltage of the first transistor and a second threshold voltage of the second transistor, wherein the fourth voltage of the second transistor is less than a sum of the second voltage of the first transistor and the second threshold voltage of the second transistor; and
supplying a first access voltage to an access line based at least in part on biasing the first transistor and biasing the second transistor.

8. The method of claim 7, further comprising:
activating a third transistor, the third transistor coupled with the first transistor and a fourth transistor; and
activating the fourth transistor to couple the third transistor with a voltage source that supplies the first voltage, wherein the first transistor is biased based at least in part on activating the third transistor and activating the fourth transistor.

9. The method of claim 7, further comprising:
deactivating a third transistor, the third transistor coupled with the second transistor and a fourth transistor; and
deactivating the fourth transistor to decouple the third transistor from a voltage source that supplies a second access voltage, wherein the second transistor is biased based at least in part on deactivating the third transistor and deactivating the fourth transistor.

10. The method of claim 7, further comprising:
decoding a memory address, wherein biasing the first transistor and the second transistor is based at least in part on decoding the memory address.

11. A method, comprising:
biasing a first transistor to a first voltage exceeding a second voltage of the first transistor and a first threshold voltage of the first transistor to activate the first transistor based at least in part on receiving a command;
biasing a second transistor to a third voltage to deactivate the second transistor, wherein a fourth voltage of the second transistor is less than the second voltage of the first transistor and a second threshold voltage of the second transistor;
supplying a first access voltage to an access line based at least in part on biasing the first transistor and biasing the second transistor;
biasing the first transistor to a fifth voltage less than the second voltage of the first transistor and the first threshold voltage of the first transistor to deactivate the first transistor;
biasing the second transistor to a sixth voltage, wherein the fourth voltage of the second transistor exceeds the sixth voltage and the second threshold voltage of the second transistor, to activate the second transistor; and
supplying a second access voltage to the access line based at least in part on biasing the first transistor and biasing the second transistor.

12. A method, comprising:
biasing a first transistor to a first voltage exceeding a second voltage of the first transistor and a first threshold voltage of the first transistor to activate the first transistor based at least in part on receiving a command;
biasing a second transistor to a third voltage to deactivate the second transistor, wherein a fourth voltage of the second transistor is less than the second voltage of the first transistor and a second threshold voltage of the second transistor;
supplying a first access voltage to an access line based at least in part on biasing the first transistor and biasing the second transistor;
biasing the first transistor to a fifth voltage to deactivate the first transistor, wherein the fifth voltage and the first threshold voltage of the first transistor is less than a sixth voltage of the first transistor;
biasing the second transistor to a seventh voltage to deactivate the second transistor, wherein the seventh voltage is less than the third voltage of the second transistor and the second threshold voltage of the second transistor; and
isolating the access line from the first access voltage or a second access voltage based at least in part on biasing the first transistor and biasing the second transistor.

13. The method of claim 12, further comprising:
biasing a third transistor to the fifth voltage that exceeds an eighth voltage of the third transistor and a third threshold voltage of the third transistor; and
supplying a third access voltage to the access line based at least in part on biasing the third transistor, wherein the third access voltage corresponds to the eighth voltage of the third transistor.

14. The method of claim 13, wherein the sixth voltage is a ground voltage associated with a reset operation.

15. An apparatus, comprising:
a memory array comprising an access line coupled with one or more memory cells;
a decoder comprising a first transistor and a second transistor; and
a controller coupled with the memory array and the decoder and configured to:
bias the first transistor to a first voltage exceeding a second voltage of the first transistor and a first threshold voltage of the first transistor to activate the first transistor based at least in part on receiving a command, wherein the second voltage of the first transistor exceeds a sum of the first voltage and the first threshold voltage of the first transistor;
bias the second transistor to a third voltage to deactivate the second transistor, wherein a fourth voltage of the second transistor is less than the second voltage of the first transistor and a second threshold voltage of the second transistor, wherein the fourth voltage of the second transistor is less than a sum of the second voltage of the first transistor and the second threshold voltage of the second transistor; and
supply a first access voltage to the access line based at least in part on biasing the first transistor and biasing the second transistor.

16. The apparatus of claim 15, further comprising:
a third transistor of the decoder;
a fourth transistor of the decoder; and
a voltage source that supplies the first voltage, wherein the controller is further configured to:
activate the third transistor of the decoder, the third transistor coupled with the first transistor and the fourth transistor; and
activate the fourth transistor of the decoder to couple the third transistor with the voltage source that supplies the first voltage, wherein the controller is configured to bias the first transistor based at least in part on activating the third transistor and activating the fourth transistor.

17. An apparatus, comprising:
a memory array comprising an access line coupled with one or more memory cells;
a decoder comprising a first transistor and a second transistor; and
a controller coupled with the memory array and the decoder and configured to:
bias the first transistor to a first voltage exceeding a second voltage of the first transistor and a first threshold voltage of the first transistor to activate the first transistor based at least in part on receiving a command;
bias the second transistor to a third voltage to deactivate the second transistor, wherein a fourth voltage of the second transistor is less than the second voltage of the first transistor and a second threshold voltage of the second transistor;
supply a first access voltage to the access line based at least in part on biasing the first transistor and biasing the second transistor;
bias the first transistor to a fifth voltage less than the second voltage of the first transistor and the first threshold voltage of the first transistor to deactivate the first transistor;
bias the second transistor to a sixth voltage, wherein the fourth voltage of the second transistor exceeds the sixth voltage and the second threshold voltage of the second transistor, to activate the second transistor; and
supply a second access voltage to the access line based at least in part on biasing the first transistor and biasing the second transistor.

18. An apparatus, comprising:
a memory array comprising an access line coupled with one or more memory cells;
a decoder comprising a first transistor and a second transistor; and
a controller coupled with the memory array and the decoder and configured to:
bias the first transistor to a first voltage exceeding a second voltage of the first transistor and a first threshold voltage of the first transistor to activate the first transistor based at least in part on receiving a command;
bias the second transistor to a third voltage to deactivate the second transistor, wherein a fourth voltage of the second transistor is less than the second voltage of the first transistor and a second threshold voltage of the second transistor;
supply a first access voltage to the access line based at least in part on biasing the first transistor and biasing the second transistor;
bias the first transistor to a fifth voltage to deactivate the first transistor, wherein the fifth voltage and the first threshold voltage of the first transistor is less than a sixth voltage of the first transistor;
bias the second transistor to a seventh voltage to deactivate the second transistor, wherein the seventh voltage is less than the third voltage of the second transistor and the second threshold voltage of the second transistor; and
isolate the access line from the first access voltage or a second access voltage based at least in part on biasing the first transistor and biasing the second transistor.

19. The apparatus of claim 18, wherein the decoder further comprises a third transistor, and wherein the controller is further configured to:
bias the third transistor to the fifth voltage that exceeds an eighth voltage of the third transistor and a third threshold voltage of the third transistor; and
supply a third access voltage to the access line based at least in part on biasing the third transistor, wherein the third access voltage corresponds to the eighth voltage.

* * * * *